(12) United States Patent
Park et al.

(10) Patent No.: US 8,132,086 B2
(45) Date of Patent: Mar. 6, 2012

(54) SEMICONDUCTOR MEMORY DEVICE FOR BYTE-BASED MASKING OPERATION AND METHOD OF GENERATING PARITY DATA

(75) Inventors: Bok-gue Park, Hwaseong-si (KR); Uk-song Kang, Yongin-si (KR); Sang-jae Rhee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1048 days.

(21) Appl. No.: 11/865,856

(22) Filed: Oct. 2, 2007

(65) Prior Publication Data

US 2008/0195919 A1    Aug. 14, 2008

(30) Foreign Application Priority Data

Feb. 13, 2007  (KR) .................. 10-2007-0015087

(51) Int. Cl.
*G06F 11/00*  (2006.01)
(52) U.S. Cl. ............ 714/801; 714/796; 714/42; 714/48; 714/52; 714/758; 714/763; 714/768; 714/803; 714/805; 714/777; 714/773; 714/769; 714/746; 714/764; 711/155; 711/105

(58) Field of Classification Search .............. None
See application file for complete search history.

(56) References Cited

U.S. PATENT DOCUMENTS

| | | | |
|---|---|---|---|
| 4,204,634 A * | 5/1980 | Barsuhn et al. ............... | 714/779 |
| 6,216,247 B1 | 4/2001 | Creta et al. | |
| 6,957,378 B2 | 10/2005 | Koga et al. | |
| 6,961,877 B2 * | 11/2005 | Si et al. .......................... | 714/49 |
| 2005/0229077 A1 * | 10/2005 | Takahashi .................... | 714/758 |
| 2008/0168331 A1 * | 7/2008 | Vogelsang et al. ............ | 714/770 |
| 2008/0195894 A1 * | 8/2008 | Schreck et al. ................. | 714/34 |
| 2008/0294841 A1 * | 11/2008 | Carnevale et al. ............ | 711/105 |

FOREIGN PATENT DOCUMENTS

JP    2005-310313    11/2005

* cited by examiner

*Primary Examiner* — John Trimmings
(74) *Attorney, Agent, or Firm* — F. Chau & Associates, LLC (57) ABSTRACT

A semiconductor memory device includes a memory cell array and an error correction code (ECC) engine. The memory cell array stores bits of normal data and parity data therein. The ECC engine performs a masking operation in a masking mode, the ECC engine calculating the parity data using the normal data. The normal data includes a first section that is to be updated and a second section that is to be saved by the masking operation.

19 Claims, 7 Drawing Sheets

FIG. 1 (PRIOR ART)

| Data bit | Error bit | Parity bit | Cell Overhead (%) |
|---|---|---|---|
| 8 | 1 | 4 | 50 % |
| 16 | 1 | 5 | 31 % |
| 32 | 1 | 6 | 18 % |
| 64 | 1 | 7 | 10 % |
| 128 | 1 | 8 | 6 % |

SEMICONDUCTOR MEMORY DEVICE FOR BYTE-BASED MASKING OPERATION AND METHOD OF GENERATING PARITY DATA

CROSS-REFERENCE TO RELATED PATENT APPLICATIONS

This application claims priority to Korean Patent Application No. 10-2007-0015087, filed on Feb. 13, 2007, in the Korean Intellectual Property Office, the disclosure of which is incorporated by reference herein in its entirety.

BACKGROUND OF THE INVENTION

1. Technical Field

The present disclosure relates to a semiconductor memory device, and more particularly, to a semiconductor memory device for a byte-based masking operation and a method of generating parity data.

2. Discussion of Related Art

Due to increasing memory capacities of semiconductor memory devices, an on-chip error recovery circuit may be needed to recover or reduce errors in a defective memory cell. An error correction code (ECC) error recovery circuit may be used as the on-chip error recovery circuit.

A semiconductor memory device having an ECC error recovery circuit includes data cells for storing data bits and parity cells for storing parity bits. The number of bits in a parity cell is selected based on an error check and correction operation. When data is read from a memory device, ECC logic executes an ECC operation to determine a result. If the result of the ECC operation is different from a certain value, the ECC logic corrects defective data and outputs corrected data. The error correction ability of the ECC error recovery, circuit is determined by the ratio of the number of data bits to the number of parity bits. When a greater number of parity bits are used to correct the errors than data bits, more errors can be corrected, however, a cell overhead also increases.

Figure 1:
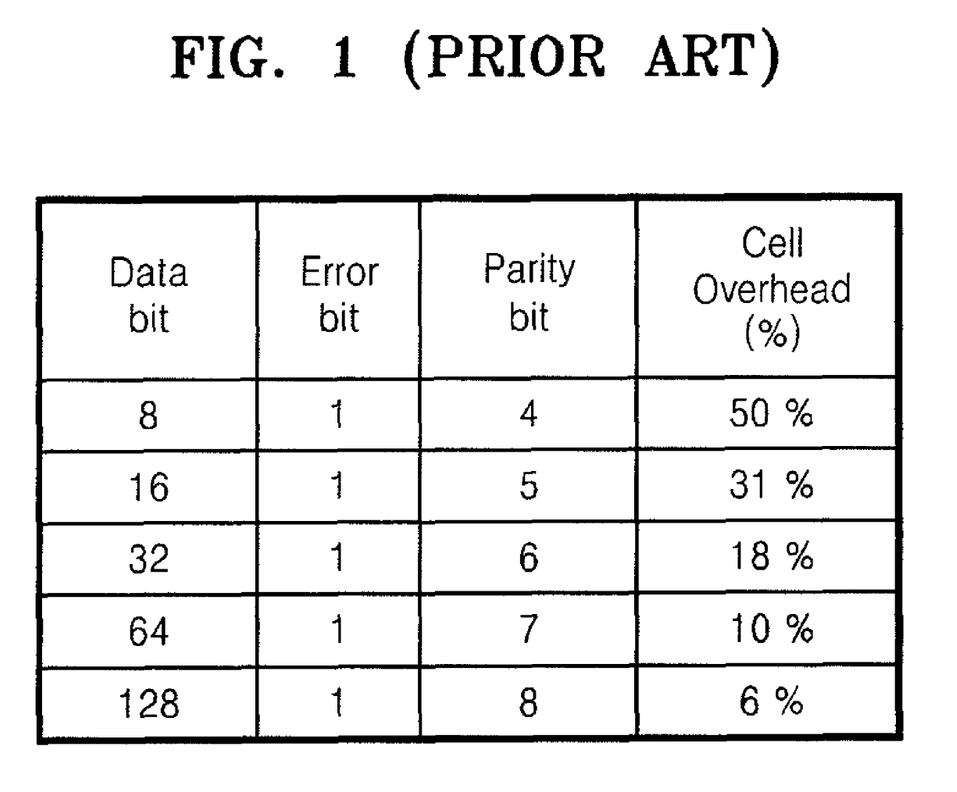
FIG. 1 is a table showing a relationship between data bits and parity bits.

FIG. 1 is a table showing a relationship between data bits and parity bits.

In FIG. 1, a hamming code, which can correct an error of one bit, is used. Referring to FIG. 1, 4 parity bits are needed to correct the error of one bit from among 8 data bits. For example, to store data in a memory of 1 GB (giga byte), a memory of 1.5 GB is needed, including 1 GB used to store data, and 0.5 GB used to store parity data. As shown in FIG. 1, when using ECC coding, the cell overhead decreases with larger bit units.

Figure 2:
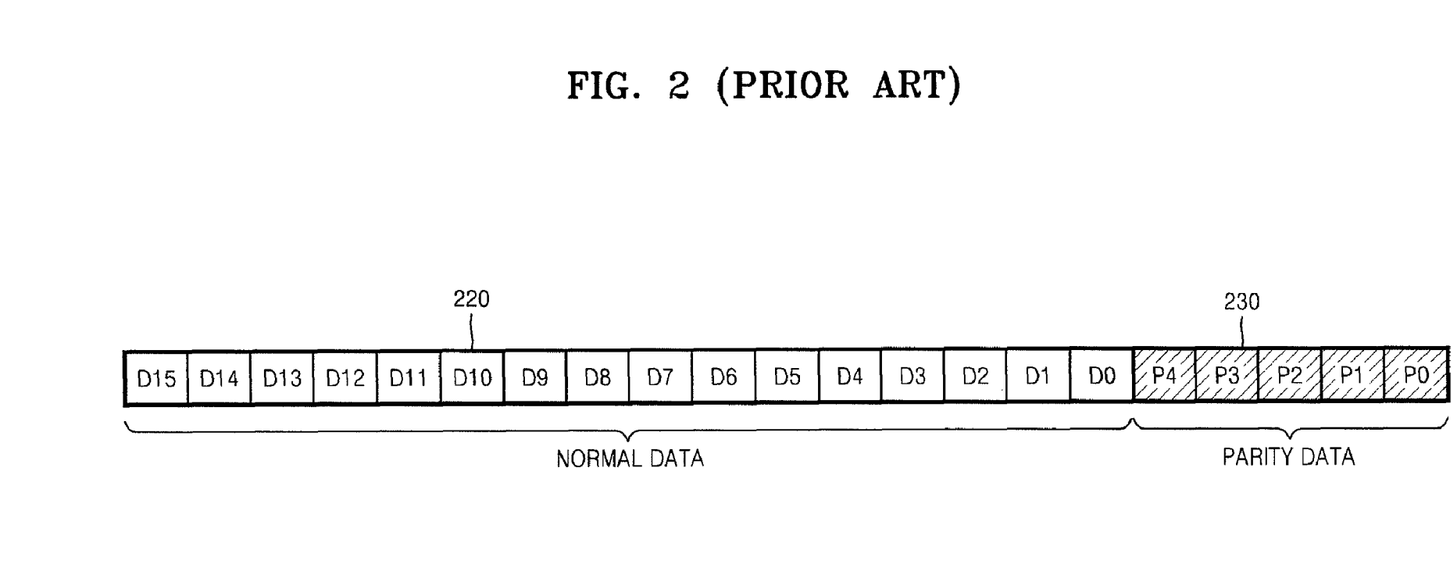
FIG. 2 shows data bits including normal data and parity data.

FIG. 2 shows data bits of normal data 220 and parity data 230.

Referring to FIG. 2, the normal data 220 has 16 data bits D0 through D15, and the parity data 230 has 5 data bits P0, P1, P2, P3, and P4. However, given the data bits of FIG. 2, a masking operation cannot be performed on an 8-bit basis (i.e., on a byte basis), where masking means restricting a processing of data in a certain range. Once a signal for controlling the masking operation is enabled, writing of corresponding data is not carried out although a write command has been issued. A masking operation is typically performed on a byte basis. For example, assume that the masking operation is performed on a byte basis so that a first section D0 through D7 of the normal data 220 is masked. The existing data is stored in the masked first section D0 through D7, and new data will be stored in a second section D8 through D15. Presently, it is not possible to update the parity data P0, P1, P2, P3, and P4 with the new data and the existing data. Thus, when the ECC coding is performed on a 16-bit (or more than a 16-bit) basis, byte-based masking is not possible.

Since data needs to be ECC coded on an 8-bit basis to perform byte-based masking, the cell overhead increases as compared to a large basis. Alternatively, when data is ECC coded on a 16-bit (or more than 16 bits) basis to reduce the cell overhead, byte-based masking is not possible.

Thus, there is a need for a semiconductor memory device which can perform ECC coding on a 16-bit basis or greater and also perform byte-based masking. There is a further need for a method of generating parity data in the semiconductor memory device.

SUMMARY OF THE INVENTION

According to an exemplary embodiment of the present invention, a semiconductor memory device includes a memory cell array and an error correction code (ECC) engine. The memory cell array stores bits of normal data and parity data therein. The ECC engine calculates the parity data using the normal data. The ECC engine performs a masking operation in a masking mode, the ECC engine calculating the parity data using the normal data. The normal data includes a first section that is to be updated and a second section that is to be saved by the masking operation.

The ECC engine may read the second section before updating the first section of the normal data. The semiconductor memory device may further include a first column selection line and a second column selection line. The first column selection line is for updating the first section of the normal data. The second column selection line is enabled before the first column section line is enabled and is for reading the second section. The ECC engine may transmit the calculated parity data to the memory cell array.

The semiconductor memory device may further include a mode selection unit that selects one of the masking mode and a normal mode in response to a mode selection signal. The ECC engine may read the second section when the mode selection signal is enabled to select the masking mode. The ECC engine may calculate the parity data using the normal data that is to be updated in the normal mode, and use a hamming code.

According to an exemplary embodiment of the present invention, a method of generating parity data in a semiconductor memory device includes a memory cell array that stores bits of normal data and the parity data therein. The method includes the steps of dividing the normal data into a first section that is to be updated and a second section that is to be saved by a masking operation during a masking mode in which the masking operation is performed and calculating the parity data using the first and second sections.

The method may further include a step of reading the second section before updating the first section of the normal data. The method may further include a step of enabling a second column selection line for reading the second section before enabling a first column selection line for updating the first section of the normal data. The method may further include a step of transmitting the calculated parity data to the memory cell array.

The method may further include a step of selecting one of the masking mode and a normal mode in response to a mode selection signal. The method may further include a step of reading the second section of the normal data when the mode selection signal is enabled to select the masking mode. The method may further include a step of calculating the parity data using the normal data that is to be updated in the normal mode.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS

Hereinafter, the present invention will be described in detail by explaining exemplary embodiments of the invention with reference to the attached drawings. Like reference numerals in the drawings denote like elements.

Figure 3:
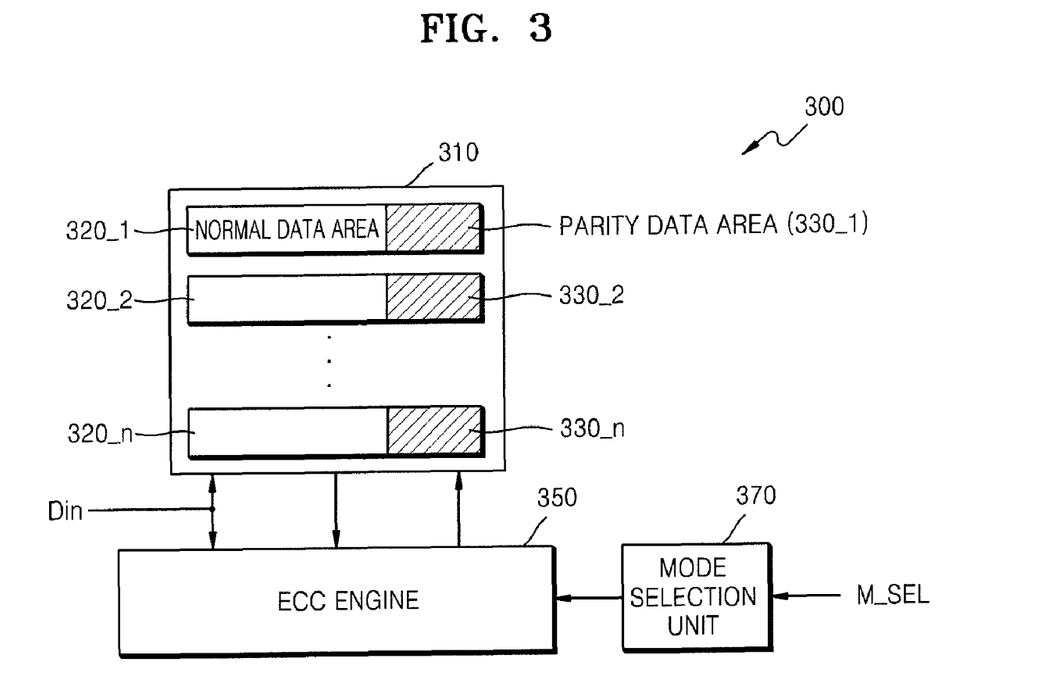
FIG. 3 is a block diagram of a semiconductor memory device according to an exemplary embodiment of the present invention.

FIG. 3 is a block diagram of a semiconductor memory device 300 according to an exemplary embodiment of the present invention. Referring to FIG. 3, the semiconductor memory device 300 includes a memory cell array 310, an error correction code (ECC) engine 350, and a mode selection unit 370.

The memory cell array 310 stores bits of normal data and bits of parity data. Each bit of normal data is respectively stored in a normal data area 320_1 through 320_n of the memory cell array 310, and each bit of the parity data is respectively stored in a parity data area 330_1 through 330_n of the memory cell array 310.

The ECC engine 350 calculates parity data using the normal data. In a masking mode, where a masking operation is performed, the ECC engine 350 calculates the parity data using the normal data. The normal data includes a first section that is to be updated, and a second section that is to be saved by the masking operation. Alternatively, in a normal mode, where the masking operation is not performed, the ECC engine 350 calculates the parity data using normal data that is to be updated. The ECC engine 350 transmits the calculated parity data to the parity data area 330_1 through 330_n in the memory cell array 310. The ECC engine 350 may use a hamming code, which is capable of correcting an error of one bit.

The mode selection unit 370 selects either the masking mode or the normal mode in response to a mode selection signal M_SEL. The ECC engine 350 operates according to the selection result of the mode selection unit 370. The mode selection signal M_SEL may be a signal generated by using a column address of the semiconductor memory device 300. The signal may also be applied from an external source through a control pin of the semiconductor memory device 300. However, the present invention is not limited thereto, as the signals may be generated or applied by other means.

Figure 4:
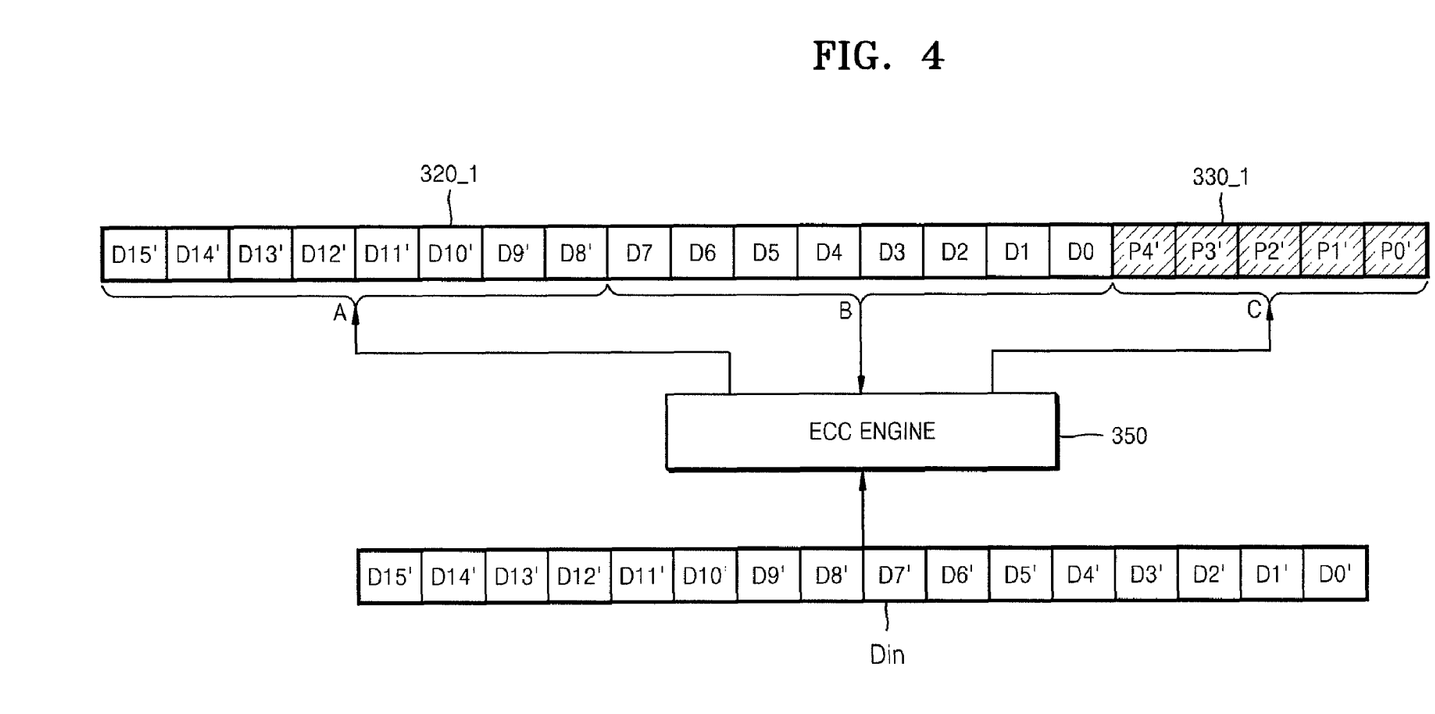
FIG. 4 is a block diagram for explaining operations of the ECC engine of the semiconductor memory device in FIG. 3 in a masking mode.

FIG. 4 is a block diagram for explaining the operations of the ECC engine 350 of the semiconductor memory device 300 in FIG. 3 in the masking mode.

Referring to FIGS. 3 and 4, operations of the ECC engine 350 will be described. Hereinafter, it is assumed that new normal data Din (D0' through D15') of 16 bits are stored and, at the same time, a byte-based masking operation is performed on a 8-bit basis while the normal data D0 through D15 of 16 bits are already stored in the normal data area 320_1.

In the masking mode, the ECC engine 350 calculates updated parity data P0', P1', P2', P3', and P4' using normal data. The normal data includes a first section A and a second section B. From among the new normal data Din (D0' through D15'), the normal data D8' through D15', which are updated without being affected by the masking operation, are defined as the first section A. From among the existing normal data D0 through D15, the normal data D0 through D7, which are not updated to the new normal data Din (D0' through D15') through the masking operation, are defined as the second section B.

The ECC engine 350 calculates the changed parity data P0', P1', P2', P3', and P4' using the second section B (D0 through D7) of the existing normal data and the first section A (D8' through D15') of the normal data Din that is to be updated. To calculate the parity data P0', P1, P2', P3', and P4', the ECC engine 350 reads the second section B (D0 through D7) of the existing normal data before storing the first section A (D8' through D15') of the new normal data Din into the normal data area 320_1. The ECC engine 350 calculates the changed parity data P0', P1, P2', P3', and P4' using the read second section B (D0 through D7) of the existing normal data and the first section A (D8' through D15') of the new normal data Din, and the first section A and the parity area 330_1 are updated to the new normal data D8' through D15' and the calculated parity data P0', P1, P2', P3', and P4'.

Figure 5A:
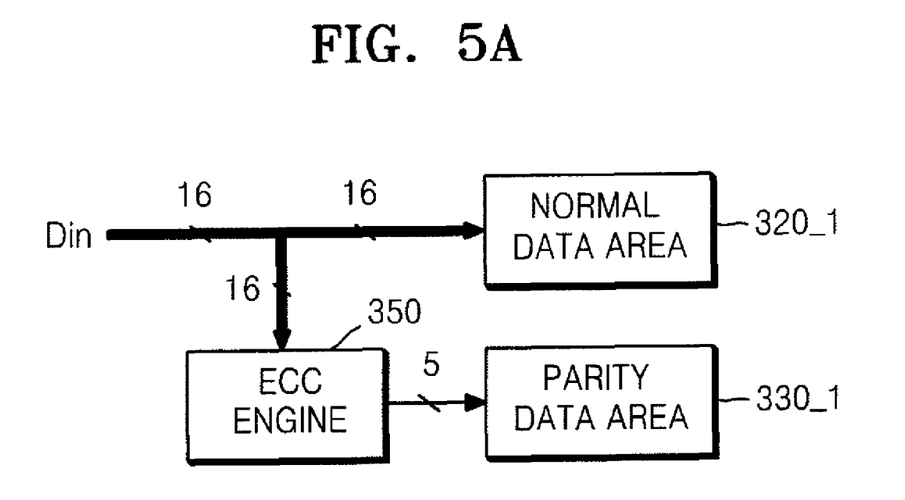
FIG. 5A is a diagram showing the data flow in the semiconductor memory device in FIG. 3 in a normal mode.

FIG. 5A is a diagram for showing the data flow in the semiconductor memory device 300 in FIG. 3 in the normal mode. Referring to FIG. 5A, the new normal data Din is input on a 16-bit basis, and, in the normal mode, the entire normal data of 16 bits are stored in the normal data area 320_1. Since the normal data is all updated, the ECC engine 350 calculates the parity data P0', P1, P2', P3', and P4' of 5 bits and transmits them to the parity data area 330_1 using the entire input normal data Din.

Figure 5B:
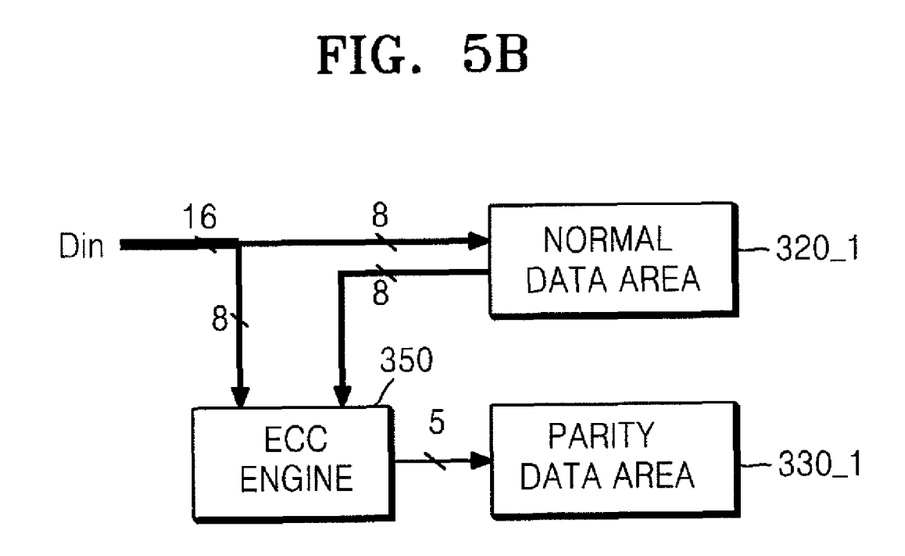
FIG. 5B is a diagram showing the data flow in the semiconductor memory device in FIG. 3 in the masking mode.

FIG. 5B is a diagram for showing the data flow in the semiconductor memory device 300 in FIG. 3 in the masking mode. Referring to FIGS. 4 and 5b, the new normal data Din is input on a 16-bit basis, and, in the masking mode, the first section A (D8' through D15') of 8 bits from among the new normal data Din of 16 bits is stored in the normal data area 320_1. The ECC engine 350 reads the second section B (D0 through D7) of 8 bits from among the existing normal data before the first section A (D8' through D15') of the new normal data Din is stored in the normal data area 320_1. The ECC engine 350 calculates the parity data P0', P1, P2', P3', and P4' of 5 bits and transmits them to the parity data area 330_1.

Figure 6:
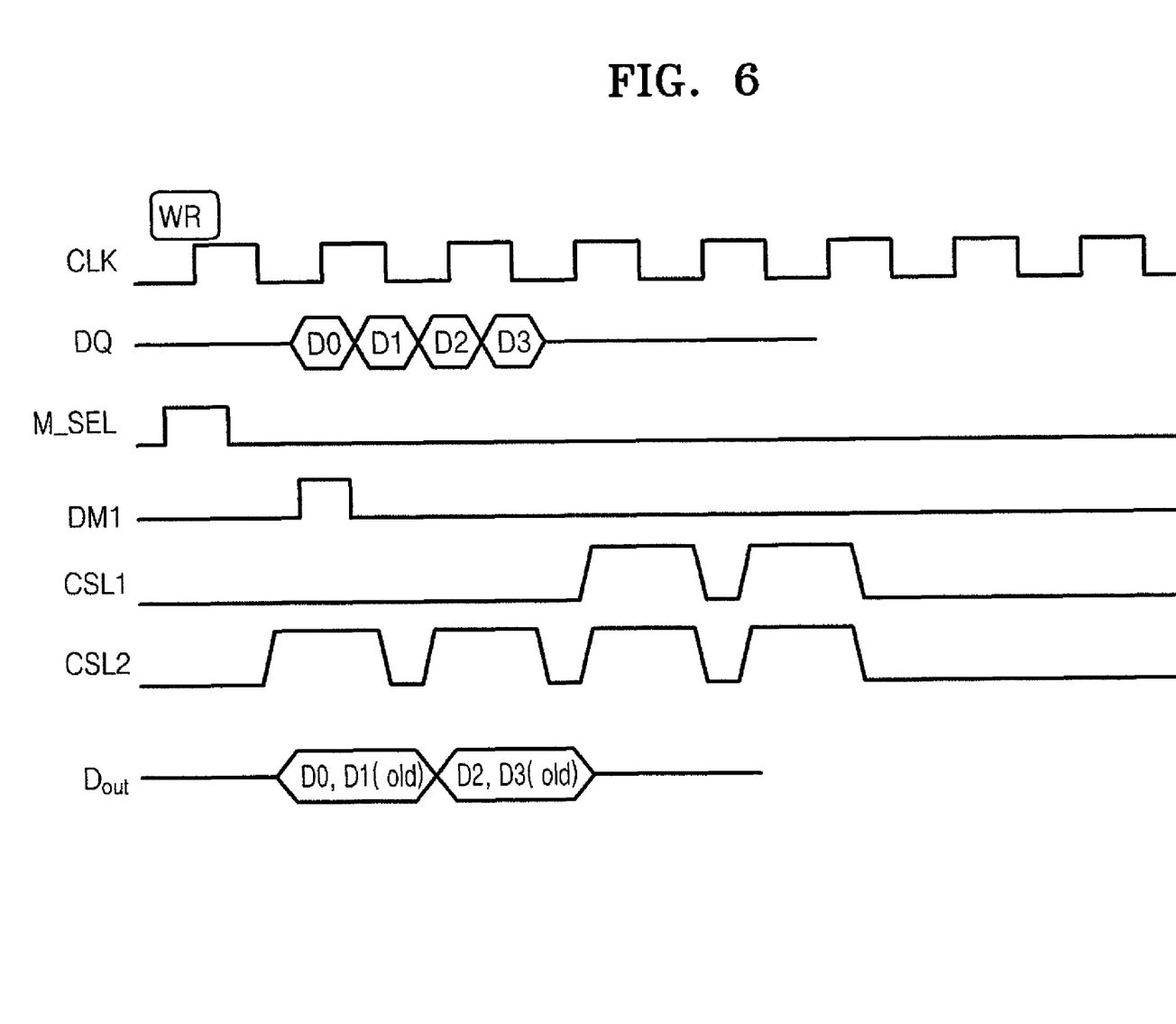
FIG. 6 illustrates signal waveforms for explaining operations of the semiconductor memory device in FIG. 3 in the masking mode.

FIG. 6 is a signal waveform for explaining the operations of the semiconductor memory device 300 in FIG. 3 in the masking mode. Referring to FIGS. 3 to 6, when a first column selection line CSL1 is enabled, the first section A (D8' through D15') of the new normal data Din is stored in the normal data area 320_1 and the updated parity data P0', P1, P2', P3', and P4' are stored in the parity data area 330_1. When a second column selection line CSL2 is enabled, the second section B (D0 through D7) of the existing normal data is read. The semiconductor memory device 300 enables the second column selection line CSL2 before enabling the first column selection line CSL1 when a mode selection signal M_SEL is enabled. When the mode selection signal M_SEL is enabled, the second column selection line CSL2 is enabled to read the second section B of the normal data. The parity data P0', P1, P2', P3', and P4' are calculated using the read normal data Dout (D0 through D7) and the normal data D8' through D15' that is to be updated. Afterwards, when the first column selection line CSL1 is enabled, the normal data D8' through D15' and the parity data P0', P1', P2', P3', and P4', which will be updated, are stored in the normal data area 320_1 and the parity data area 330_1, respectively. According to an embodiment of the present invention, the mode selection signal M_SEL is enabled before a masking signal DM1 is enabled, thereby indicating that the masking mode is activated. The existing data may then be read before new data is stored.

Figure 7:
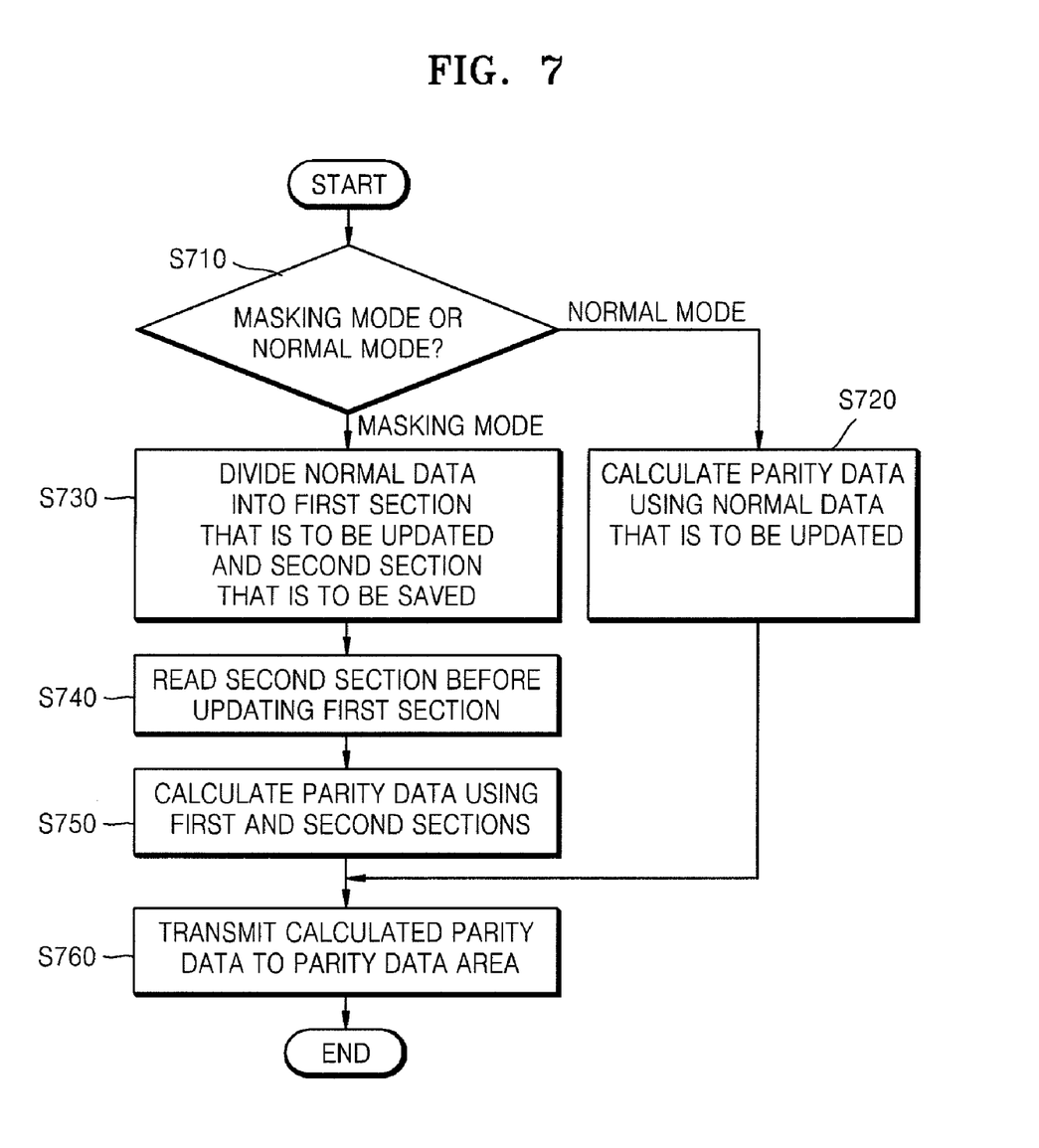
FIG. 7 is a flowchart of a method for generating parity data according to an exemplary embodiment of the present invention.

FIG. 7 is a flowchart of a method for generating parity data according to an exemplary embodiment of the present invention. Referring to FIGS. 3, 4, and 7, the mode selection unit 370 selects either a masking mode or a normal mode in response to the mode selection signal M_SEL (S710). In the normal mode, the ECC engine 350 calculates the parity data using the normal data Din that is to be updated (S720). In the masking mode, the ECC engine 350 divides the normal data into the first section A that is to be updated and the second section B that is to be saved (S730). The ECC engine 350 defines the first section A (D8' through D15'), which is to be updated, from among the new normal data Din without being affected by the masking operation, and the second section B (D0, D1, . . . , and D7), which is not to be updated to the normal data Din, from among the existing normal data by being affected by the masking operation. The ECC engine 350 reads the second section B before updating the first section A (S740). The ECC engine 350 calculates the parity data P0', P1', P2', P3', and P4' that is to be updated using the first section A that is to be updated and the read second section B (S750). The ECC engine 350 transmits the calculated parity data P0', P1', P2', P3', and P4' to the parity data area 330_1 (S760).

Although embodiments of the present invention have been described with the normal data having 16 bits and the first section A and the second section B having 8 bits, the present invention is not limited thereto as this is merely an example. The normal data and the first and second sections may have a different number of bits. Further, the byte-based masking is not limited to being performed on a 16-bit normal data. For example, the byte-based masking may be performed on 32-bit normal data or 64-bit normal data.

In a semiconductor memory device and a method of generating parity data according to an embodiment of the present invention, before new normal data is updated, some of the existing normal data on which a masking operation is performed is read and parity data is calculated using the new normal data and the read normal data, thereby enabling ECC coding of the data on a 16-bit (or more) basis and simultaneous byte-based masking, and reduction of write time latency.

While the present invention has been particularly shown and described with reference to exemplary embodiments thereof, it will be understood by one of ordinary skill in the art that various changes in form and details may be made therein without departing from the spirit and scope of the present invention.

What is claimed is:

1. A semiconductor memory device comprising:
a memory cell array that stores bits of normal data and parity data therein;
an error correction code (ECC) engine that calculates the parity data using the normal data;
a mode selection unit that selects one of a masking mode and a normal mode in response to a mode selection signal;
a first column selection line for updating a first section of the normal data; and
a second column selection line for reading a second section of the normal data,
wherein the ECC engine calculates the parity data using the normal data that includes the first section that is to be updated and the second section that is to be saved by a masking operation during the masking mode in which the masking operation is performed,
wherein the ECC engine reads the second section when the mode selection signal is enabled to select the masking mode,
wherein the mode selection signal is enabled before a masking signal is enabled, thereby indicating that the masking mode is activated, and
wherein the second column selection line is enabled before the first column selection line is enabled when the mode selection signal is enabled.

2. The semiconductor memory device of claim 1, wherein the ECC engine reads the second section before updating the first section of the normal data.

3. The semiconductor memory device of claim 1, wherein the ECC engine transmits the calculated parity data to the memory cell array.

4. The semiconductor memory device of claim 1, wherein the mode selection signal is generated using a column address of the semiconductor memory device.

5. The semiconductor memory device of claim 1, wherein the mode selection signal is applied through a control pin of the semiconductor memory device.

6. The semiconductor memory device of claim 1, wherein, in the masking mode, the masking operation is performed on an 8-bit basis.

7. The semiconductor memory device of claim 1, wherein the normal data is 16 bits.

8. The semiconductor memory device of claim 7, wherein the first section or the second section of the normal data is 8 bits.

9. The semiconductor memory device of claim 7, wherein the first section is the first eight bits of the normal data and the second section is the last eight bits of the normal data.

10. The semiconductor memory device of claim 7, wherein the first section is the last eight bits of the normal data and the second section is the first eight bits of the normal data.

11. The semiconductor memory device of claim 1, wherein the ECC engine calculates the parity data using the normal data that is to be updated in the normal mode.

12. The semiconductor memory device of claim 1, wherein the ECC engine uses a hamming code.

13. A method of generating parity data in a semiconductor memory device that includes a memory cell array that stores bits of normal data and the parity data, the method comprising:
selecting one of a masking mode and a normal mode in response to a mode selection signal;

dividing the normal data into a first section that is to be updated and a second section that is to be saved by a masking operation during the masking mode in which the masking operation is performed;

enabling a second column selection line for reading the second section before enabling a first column selection line for updating the first section of the normal data when the mode selection signal is enabled;

reading the second section of the normal data when the mode selection signal is enabled to select the masking mode and when the second column selection line is enabled; and calculating the parity data using the first and second sections, wherein the mode selection signal is enabled before a masking signal is enabled, thereby indicating that the masking mode is activated.

14. The method of claim 13, further comprising: reading the second section before updating the first section of the normal data.

15. The method of claim 13, further comprising: transmitting the calculated parity data to the memory cell array.

16. The method of claim 13, wherein the mode selection signal is generated using a column address of the semiconductor memory device.

17. The method of claim 13, wherein the mode selection signal is applied through a control pin of the semiconductor memory device.

18. The method of claim 13, wherein, in the masking mode, the masking operation is performed on an 8-bit basis.

19. The method of claim 13, further comprising: calculating the parity data using the normal data that is to be updated in the normal mode.

* * * * *